(12) United States Patent
Soderlund et al.

(10) Patent No.: US 10,590,536 B2
(45) Date of Patent: Mar. 17, 2020

(54) APPARATUS, METHOD AND REACTION CHAMBER

(71) Applicant: BENEQ OY, Espoo (FI)

(72) Inventors: Mikko Soderlund, Helsinki (FI); Pekka Soininen, Helsinki (FI); Jarmo Maula, Espoo (FI)

(73) Assignee: BENEQ OY, Vantaa (FI)

( * ) Notice: Subject to any disclaimer, the term of this patent is extended or adjusted under 35 U.S.C. 154(b) by 0 days.

(21) Appl. No.: 16/201,714

(22) Filed: Nov. 27, 2018

(65) Prior Publication Data

US 2019/0127850 A1 May 2, 2019

Related U.S. Application Data

(62) Division of application No. 13/991,977, filed as application No. PCT/FI2012/050061 on Jan. 24, 2012, now Pat. No. 10,167,551.

(30) Foreign Application Priority Data

Jan. 26, 2011 (FI) ...................................... 20115073

(51) Int. Cl.
| | | |
|---|---|---|
| *C23C 16/00* | (2006.01) | |
| *C23C 16/455* | (2006.01) | |
| *H01L 21/67* | (2006.01) | |

(52) U.S. Cl.
CPC .... *C23C 16/45544* (2013.01); *H01L 21/6719* (2013.01)

(58) Field of Classification Search
CPC ................................ C23C 16/00; H01L 21/00
See application file for complete search history.

(56) References Cited

U.S. PATENT DOCUMENTS

| | | | |
|---|---|---|---|
| 6,174,377 B1 * | 1/2001 | Doering | ................. C23C 16/44 |
| | | | 118/715 |
| 8,349,085 B2 | 1/2013 | Tahara et al. | |
| | (Continued) | | |

FOREIGN PATENT DOCUMENTS

| | | |
|---|---|---|
| EP | 1075023 A1 | 2/2001 |
| GB | 2426252 A | 11/2006 |
| | (Continued) | |

OTHER PUBLICATIONS

Taiwanese Office Action dated Aug. 19, 2015 in related Taiwanese Patent Application No. 101102786, with English translation.
(Continued)

*Primary Examiner* — Gordon Baldwin
*Assistant Examiner* — Mohammad Mayy
(74) *Attorney, Agent, or Firm* — Robert P. Michal, Esq.; Carter, DeLuca & Farrell LLP

(57) ABSTRACT

The present invention relates to an apparatus, method, a reaction chamber and a use of a reaction chamber for processing a surface of a substrate by subjecting the surface of a substrate to successive surface reactions of at least a first precursor and a second precursor. The apparatus comprises a vacuum chamber; a detachable reaction chamber arranged to be installed inside the vacuum chamber, and inside which the substrate is positioned during processing and a precursor system for supplying the at least first and second precursors into the action chamber and for discharging the at least first and second precursors from the reaction chamber. According to the present invention the reaction chamber is provided as a gastight vessel.

5 Claims, 3 Drawing Sheets

(56) References Cited

U.S. PATENT DOCUMENTS

2002/0009592 A1 1/2002 Kitano et al.
2003/0148041 A1 8/2003 Bewig et al.
2004/0065258 A1 4/2004 Sandhu et al.
2008/0202419 A1 8/2008 Smith et al.
2010/0167503 A1 7/2010 Lei et al.

FOREIGN PATENT DOCUMENTS

TW      200847267 A    12/2008
WO   WO-2010089459 A1   8/2010
WO   WO-2010146234 A1  12/2010

OTHER PUBLICATIONS

Finnish Search Report dated Oct. 25, 2011 in related Finnish Patent Application No. 20115073, with translation.
International Search Report dated Apr. 30, 2012 in International Application No. PCT/FI2012/050061.
International Preliminary Report on Patentability issued in International Application No. PCT/FI2012/050061, dated Mar. 28, 2013.
Office Action issued in U.S. Appl. No. 13/991,977 dated Aug. 28, 2015 (6 pages).
Office Action issued in U.S. Appl. No. 13/991,977 dated Jun. 17, 2016 (8 pages).
Office Action issued in U.S. Appl. No. 13/991,977 dated Jul. 3, 2017 (11 pages).
Office Action issued in U.S. Appl. No. 13/991,977 dated Nov. 30, 2017 (10 pages).

* cited by examiner

APPARATUS, METHOD AND REACTION CHAMBER

CROSS-REFERENCE TO RELATED APPLICATIONS

This application is a divisional of U.S. patent application Ser. No. 13/991,977 filed on Jun. 6, 2013 which is a National Stage Entry of International Application No. PCT/FI2012/050061 filed on Jan. 24, 2012, which claims the benefit of and priority to Finnish Patent Application No. 20115073 filed on Jan. 26, 2011, the disclosure of each of these applications is expressly incorporated herein by reference in their entirety.

FIELD OF THE INVENTION

The present invention relates to an apparatus for processing a surface of a substrate, and especially to an apparatus for processing a surface of a substrate by subjecting the surface of a substrate to successive surface reactions of at least a first precursor and a second precursor. The present invention further relates to a reaction chamber. The present invention also further relates to a method for loading substrates.

BACKGROUND OF THE INVENTION

Substrates, especially sensitive substrates, have to be handled isolated during the production process so that the substrates are not subjected to contamination, moisture, oxygen, other gases or other conditions deteriorating the sensitive substrates. Therefore these sensitive substrates have to be handled such that they are subjected as little as possible to deteriorating conditions. The sensitive substrate may be for example moisture, water vapour and oxygen sensitive organic light-emitting diodes (OLEDs).

When the sensitive substrates are coated or processed in a coating apparatus by subjecting the substrates at least partly to surface reactions of at least a first precursor and a second precursor, the sensitive substrates have to be loaded to the coating apparatus such that the substrates are subjected to deteriorating conditions as little as possible. The substrates may be processed by subjecting the substrates to surface reactions of at least the first and second precursor according to the principles of atomic layer deposition (ALD).

Conventionally the sensitive substrates are loaded to a shipment box or bag in the manufacturing line. The shipment box usually comprises an inert gas atmosphere, such as nitrogen atmosphere, for keeping the substrates isolated from the deteriorating conditions. The substrates are loaded into the shipment box in an inert gas atmosphere and the shipment box is then transported to processing site. In the processing site the shipment box is unloaded in a glove box having an inert gas atmosphere. From the glove box the substrates are quickly transferred and loaded to the coating apparatus in the ambient atmosphere. In this context, ambient atmosphere means atmosphere present in any operation environment of an ALD reactor, ranging from a factory-like production facility with a high amount of airborne impurities and/or uncontrolled humidity to a special-purpose environment such as a cleanroom with an extremely low (but usually nonzero) amount of impurities and potentially carefully regulated humidity. Therefore the substrates are subjected to ambient atmosphere and moisture during loading to the coating apparatus. In the coating apparatus the substrates are flushed with inert gas flow. However, the quality of the sensitive substrates is compromised as the substrates are subjected to ambient atmosphere and moisture during loading to the coating apparatus.

This prior art problem is solved by integrating the glove box to the coating apparatus. This arrangement allows inert handling of the substrates from the shipment box into the coating apparatus such that the substrates are not subjected to ambient atmosphere or other deteriorating conditions. Thus the substrates may be unloaded from the shipment box in the glove box and loaded into the coating apparatus via a load-lock having a separate vacuum chamber equipped with a gate valve for connecting the glove box to the coating apparatus.

The problem of the prior art arrangement in which the glove box is integrated to the coating apparatus is that the glove box is subjected to elevated temperatures, process gases and possible impurities during loading and unloading of the coating apparatus. Usually cross-contamination of the coating apparatus and the glove box is likely to happen. To minimize the contamination the operating temperature of the coating apparatus must be limited to about 50° C. Furthermore, the integration of the glove box and the coating apparatus has to be permanent for efficient purification of the inert gas glove box. The permanent integration limits the usability of both the coating apparatus and the glove box to a specific planned application, which is undesirable as the coating apparatus may not process different kind of substrates.

BRIEF DESCRIPTION OF THE INVENTION

The object of the present invention is to provide an apparatus, reaction chamber and a method so as to overcome the prior art disadvantages. The objects of the present invention are achieved with an apparatus described herein. The objects of the present invention are further achieved with a reaction chamber described herein. The objects of the present invention are also achieved with a method described herein.

The preferred embodiments of the invention are disclosed herein.

The present invention is based on the idea of providing a detachable or separate reaction chamber which is hermetically sealable. The reaction chamber of the present invention may receive one or more substrates and it may be installed to a coating apparatus for subjecting at least part of a substrate to surface reactions of at least a first and second precursor.

The reaction chamber comprises a loading door through which the substrates are loaded into the reaction chamber and unloaded from reaction chamber. The reaction chamber further comprises precursor connections for supplying precursors into the reaction chamber and discharging the precursors from the reaction chamber. According to the present invention the reaction chamber is provided to be hermetically sealable such that the reaction space inside the reaction chamber may be closed in a gastight manner. This may be achieved by providing the loading door with a door sealing for closing the loading door in a gastight manner. Furthermore, also the precursor connections are provided with a gas sealing for closing the gas connections in a gastight manner. Therefore, the reaction chamber may be hermetically closed after the substrates are loaded into the reaction chamber.

The present invention is also based on the idea of providing a method for loading one or more substrates into an apparatus arranged to process the substrates by subjecting at least part of the substrate to successive surface reactions of at least a first precursor and a second precursor. The method comprises loading the one or more substrates into a reaction chamber in a loading chamber having an inert gas atmosphere and installing the reaction chamber to the apparatus for processing the substrates. The method further comprises closing the reaction chamber hermetically inside the loading chamber after one or more substrates are loaded into the reaction chamber. The hermetically closed reaction chamber may further be installed into the apparatus, or inside a vacuum chamber of the apparatus, for processing the substrates.

The present invention has the advantage that it enables loading the substrates into a reaction chamber and installing the reaction chamber further into an apparatus for processing the substrates such that the inert handling of the substrates is not broken during the loading. Thus the present invention solves the prior art contamination problems. Furthermore, the present invention enables the loading chamber, for example the glove box, to be located separate or remote in relation to the coating apparatus, which enhances flexibility and usability of the coating apparatus and enables use of wide range of processing temperatures. The present invention also forms the reaction chamber into a movable and hermetically closable vessel, which may be used also for storing and transporting substrates without subjecting them to contamination, moisture or other kinds of harmful conditions.

BRIEF DESCRIPTION OF THE FIGURES

In the following the invention will be described in greater detail, in connection with preferred embodiments, with reference to the attached drawings, in which FIG. 1 schematically shows one embodiment of a coating apparatus according to the present invention.

DETAILED DESCRIPTION OF THE INVENTION

Figure 1:
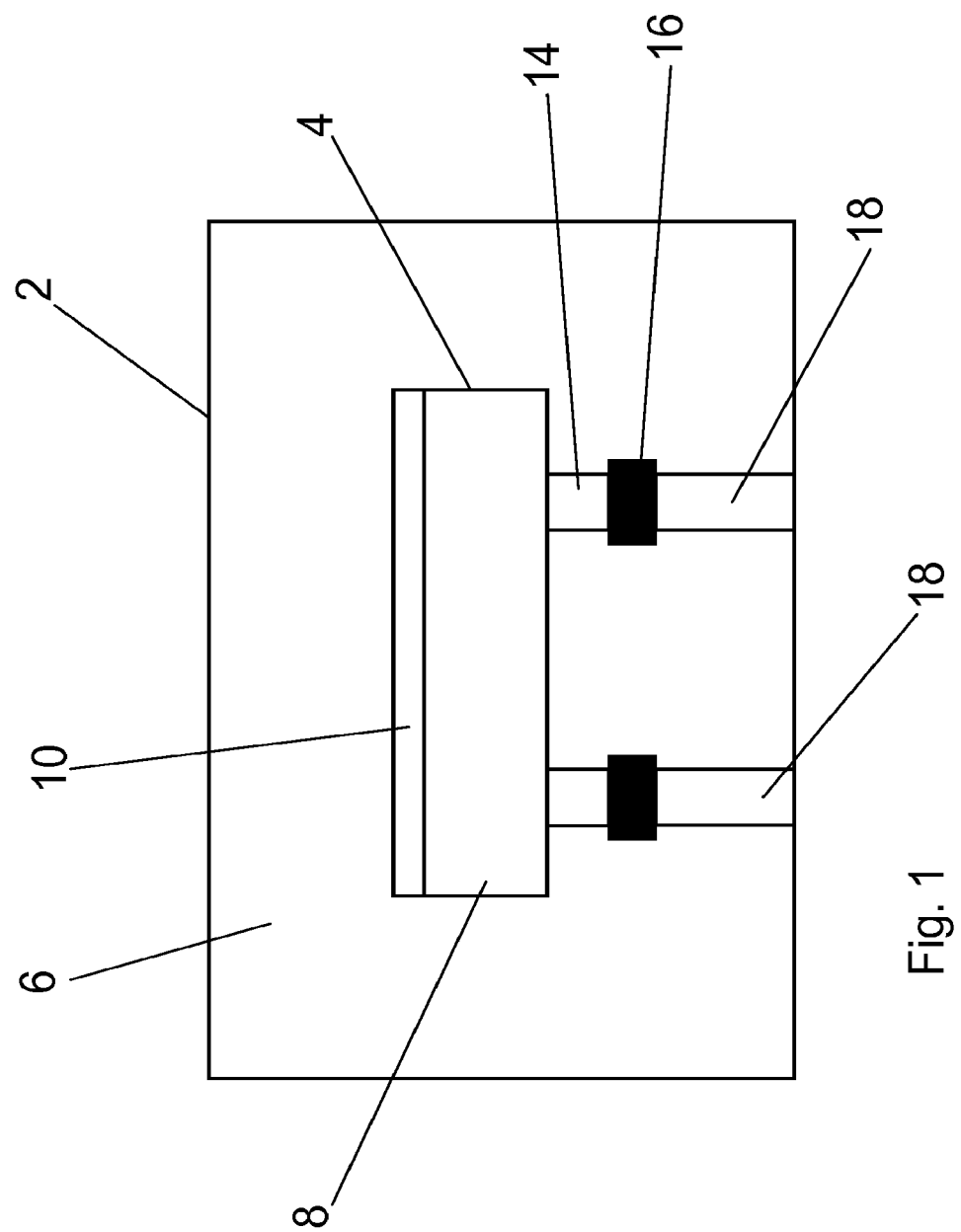

FIG. 1 shows schematically one embodiment of the present invention. In FIG. 1 there is shown an apparatus for processing a surface of a substrate by subjecting the surface of a substrate to successive surface reactions of at least a first precursor and a second precursor. Thus the apparatus may be operated according to the principles of atomic layer deposition (ALD) or any corresponding method. As shown in FIG. 1, the coating apparatus comprises a vacuum chamber 2. The apparatus is thus provided with means for providing a vacuum (not shown) into the vacuum chamber 2. The means for providing a vacuum into the vacuum chamber 2 may comprise a vacuum pump. The vacuum chamber 2 also comprises an installation door or hatch (not shown) through which the substrates are installed into the vacuum chamber 2.

In some embodiments the vacuum chamber 2 may also comprise heating means for heating up the inner space 6 of the vacuum chamber 2 to an elevated process temperature. The vacuum chamber 2 may also be provided with a service door or hatch (not shown) for maintenance and service of the vacuum chamber 2.

As shown in FIG. 1, a reaction chamber 4 is installed inside vacuum chamber 2. The reaction chamber 4 is a detachable reaction chamber 4 which may be installed inside the vacuum chamber 2 and removed from the vacuum chamber 2. The reaction chamber 4 is arranged to receive one or more substrates and the substrates are processed inside the reaction chamber 4.

The reaction chamber 4 comprises a body 8 and a loading door 10 provided to the body 8 for loading one or more substrates into the reaction chamber 4 and unloading the one or more substrates from the reaction chamber 4. In the embodiment of FIG. 1 the loading door 10 is formed as a lid to the body 8 of the reaction chamber 4. The lid 10 may be detachable such that it may be removed from the body 8 of the reaction chamber 4. In an alternative embodiment the lid 10 is openable such that it may be moved between a closed position and an open position. In a further alternative embodiment the loading door 10 may be a gate valve or the like. In this embodiment the substrates may be loaded and unloaded from the reaction chamber 4 through the gate valve.

The coating apparatus further comprises a precursor system which is arranged to supply at least a first and a second precursor into the reaction chamber 4 during processing of the substrate when the reaction chamber 4 is installed inside the vacuum chamber 2. The precursor system is also arranged to discharge excess precursors from the reaction chamber 4. In one embodiment the precursors are supplied into and discharged from the reaction chamber 4 successively in pulsed manner using the precursor system. As shown in FIG. 1, the precursor system of the apparatus comprises precursor system connections 18 through which the at least first and second precursor are supplied into and removed from the reaction chamber 4. In other words the precursor system connections 18 are arranged to be connected to the reaction chamber 4 as the reaction chamber 4 is installed into the vacuum chamber 2 or to the coating apparatus. Therefore, the precursor system connections 18 provide the reaction chamber 4 into a fluid connection with the precursor system of the coating apparatus. The precursor system connections 18 may be pipes, channels or the like suitable for conducting especially gaseous precursors.

In some embodiments the precursor system may also comprise precursor containers or bottles and means for supplying and discharging the precursors. The means for supplying and discharging the precursors may comprise pumps and valves used for supplying and discharging the precursors.

In one embodiment the reaction chamber 4 comprises precursor connections 14 which may be connected to the precursor system connections 18. The precursor connections 14 are arranged to supply and discharge the at least first and second precursors into the and from the reaction space of the reaction chamber 4. Thus, the precursor connections 14 provide a fluid connection between the reaction space of the precursor chamber 4 and the precursor system connections 18. The precursor system connections 18 and the precursor connections 14 may be provided with couplings for connecting the reaction chamber 4 in fluid connection with the precursor system 18.

In the present invention the reaction chamber 4 is formed as a detachable or removable reaction chamber which may be sealed and closed in gastight manner. When the reaction chamber 4 is sealed and closed in gastight manner it forms a gastight vessel in which substrates may be stored or transported. Therefore the reaction chamber 4 may be hermetically sealed during installing the reaction chamber 4 to the coating apparatus or inside the vacuum chamber 2.

In the present invention terms gastight and hermetic mean that the reaction chamber is substantially gastight or hermetic. This means that gas leakage into the reaction chamber or from the reaction is minimal. In one embodiment the leakage of the reaction of the present invention corresponds substantially the leakage of the typical glove box. Therefore the leakage of the reaction chamber may be such that the contaminant concentration inside the reaction chamber is around 1 ppm or less. In another embodiment the leakage of the gastight reaction chamber is smaller than $1*10^{-3}$ mbarcm$^3$/s, preferably smaller than $1*10^{-5}$ mbarcm$^3$/s, more preferably smaller than $1*10^{-8}$ mbarcm$^3$/s and most preferably smaller than $1*10^{-12}$ mbarcm$^3$/s. The leakage value may be adjusted according to the embodiment and use of the reaction chamber. The leakage value is affected by the construction and detailed elements of the reaction chamber. n one embodiment the gastight or hermetical means that less than 10% of the gas volume inside the reaction chamber is exchanged during storing and/or transporting the reaction chamber when the substrates are inside the reaction chamber. Therefore, when the reaction chamber is gastight, the substrates are substantially unaffected by the harmful gases or moisture of the ambient atmosphere.

The reaction chamber 4 usually comprises a loading door 10 and the precursor connections 14 which are at least partly open to the ambient atmosphere. In the present invention the loading door 10 and the precursor connections are hermetically sealable or closable such that gas exchange between the reaction space of the reaction chamber 4 and the ambient atmosphere is prevented. For achieving this, the loading door 10 of the reaction chamber 4 comprises one or more door sealings (not shown) for closing the loading door 10 in a gastight manner. The precursor connections 14 for supplying and discharging the at least first and second precursor to and from the reaction chamber 4 are provided with a gas sealing 16 for closing the gas connections 14 in a gastight manner. When gate valve is used as a loading door 10, the gate valve is provided such that it may be closed in a gastight or hermetic manner. Thus the gate valve may also be provided with one or more gate valve sealings. The gate valve does not have to be provided to the top wall of the reaction chamber 4 but it may also be provided to the side walls of the reaction chamber 4.

Figure 2:
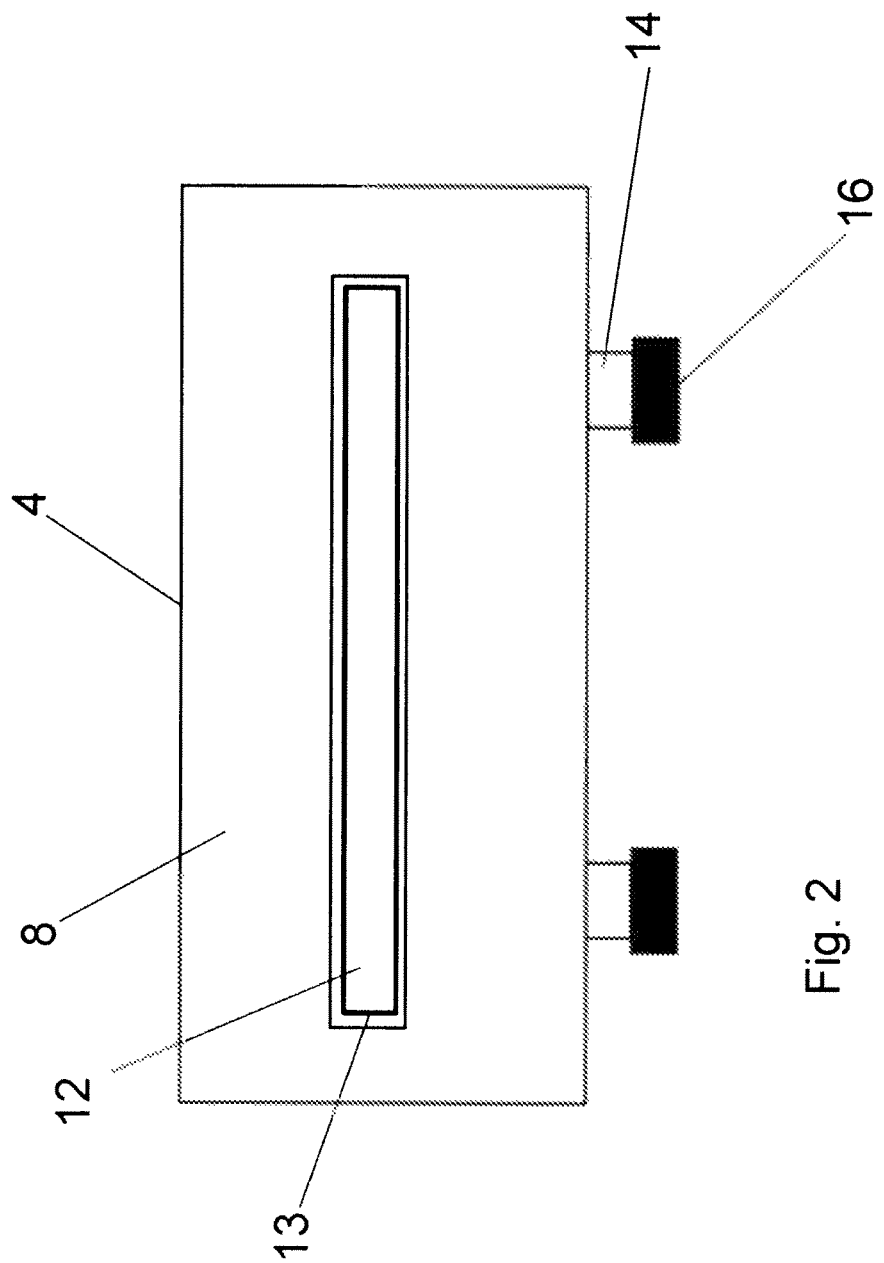
FIG. 2 schematically shows one embodiment of a reaction chamber according to the present invention.

FIG. 2 shows one embodiment of a reaction chamber 4 according to the present invention. The reaction chamber 4 comprises a chamber body 8 and a loading door 12 provided to the chamber body 8. The chamber body forms a reaction space inside the reaction chamber 4. In FIG. 2 the loading door 12 is a hatch or a gate valve provided to the side of the chamber body 8. The hatch 12 is movable between an open position for loading and unloading substrates and a closed position for closing the reaction chamber 4. Alternatively the gate valve may be opened in an open position for loading and unloading substrates 20 and closed in a closed position for closing the reaction chamber 4.

The hatch 12 is provided with one or more sealing elements 13 for sealing the hatch 12 hermetically in a closed position. The sealing element 13 may be a sealing profile, sealing ring, sealing strip, metal seal or the like arranged to provide a gastight sealing of the hatch 12 in closed position. In FIG. 2 the loading door is formed as a hatch, but in an alternative embodiment of the reaction chamber 4 the loading door may also be a lid 10 as shown in FIG. 1 or some other kind of loading door. The lid 10, hatch 12, gate valve or another kind of loading door may be detachable such that it may be removed from the chamber body 8 or it may be movable between an open position and a closed position. The loading door may be hermetically sealed with one or more sealing elements 13 irrespective of the type of the loading door.

As shown in FIG. 2, the reaction chamber 4 further comprises precursor connections 14 for supplying and discharging the at least first and second precursor to and from the reaction space of the reaction chamber 4. The precursor connections 14 may comprise pipes, duct or channels for conducting the precursors. 9. The precursor connections 14 may comprise at least one inlet connection for supplying at least the first and second precursor into the reaction chamber 4 and at least one outlet connection for discharging at least the first and second precursor from the reaction chamber 4. The precursor connections 14 may also be used for supplying and discharging purge gases, carrier gases, reaction products and some other process gases into and from the reaction chamber.

In one embodiment of the present invention the precursor connections 14 are formed such that they may be hermetically closed or sealed. Therefore the precursor connections 14 are provided with gastight sealings for closing the precursor connections 14. The gastight closing of the precursor connections 14 may be achieved by providing the precursor connections 14 with gas valves 16 for hermetically sealing the gas connections 14. The gas valves 16 are formed such that they may be operated manually or automatically to open and close the precursor connections 14. Thus the gas valves 16 may be set to an open state in which precursors or other fluids may be flow through the precursor connections 14 and to a closed state in which the precursor connections 14 are hermetically closed. Also other kinds of valves or sealing instruments may be used instead of gas valves 16.

The reaction chamber may also be provided such that it is vacuum tight, underpressure tight, and/or overpressure tight. This means that the precursor connections 14, gas valves 16 and the loading door 10, 12 is also provided vacuum tight and/or over pressure tight. This kind of reaction chamber 4 may operate also as a vacuum chamber and separate vacuum chamber is not needed. In this kind of embodiment the reaction chamber 4 may be just connected to precursor system connections 18 for processing the substrates. Thus no separate vacuum chamber is needed. It should also be noted that it is not necessary to provide vacuum or over pressure into the reaction chamber 4 but the reaction chamber may operate at substantially normal pressure (NTP, 0°, 1 bar). The reaction chamber 4 may be provided with internal heaters or it may be positioned inside a heating unit during the processing of the substrates 20. In a most simple embodiment the precursor connections 14 of the reaction chamber 4 are only connected to the precursor system connections 18 and then the substrates may be processed.

In a yet alternative embodiment the reaction chamber 4 does not comprise any loading door 10, 12. In this embodiment the substrate 20 may be powders, small objects, flexible objects or flexible elongated strips or the like which may be loaded into and unloaded from the reaction chamber 4 through the precursor connections 14. In this embodiment one precursor connection 14 may be provided to the bottom wall of the reaction chamber 4 and one other on the top wall of the reaction chamber 4. The precursor connects 14 may thus used for both loading and unloading substrates and for supplying and discharging precursors. Thus the gastight sealable vessel of the present invention may be used for as reaction chamber or as shipment box. Thus the present invention provides a shipment box which may be functionally connected to an apparatus for processing the substrates such that the substrates may be unloaded from the shipment box directly into the process chamber or a separate reaction chamber of the apparatus.

Figure 3:
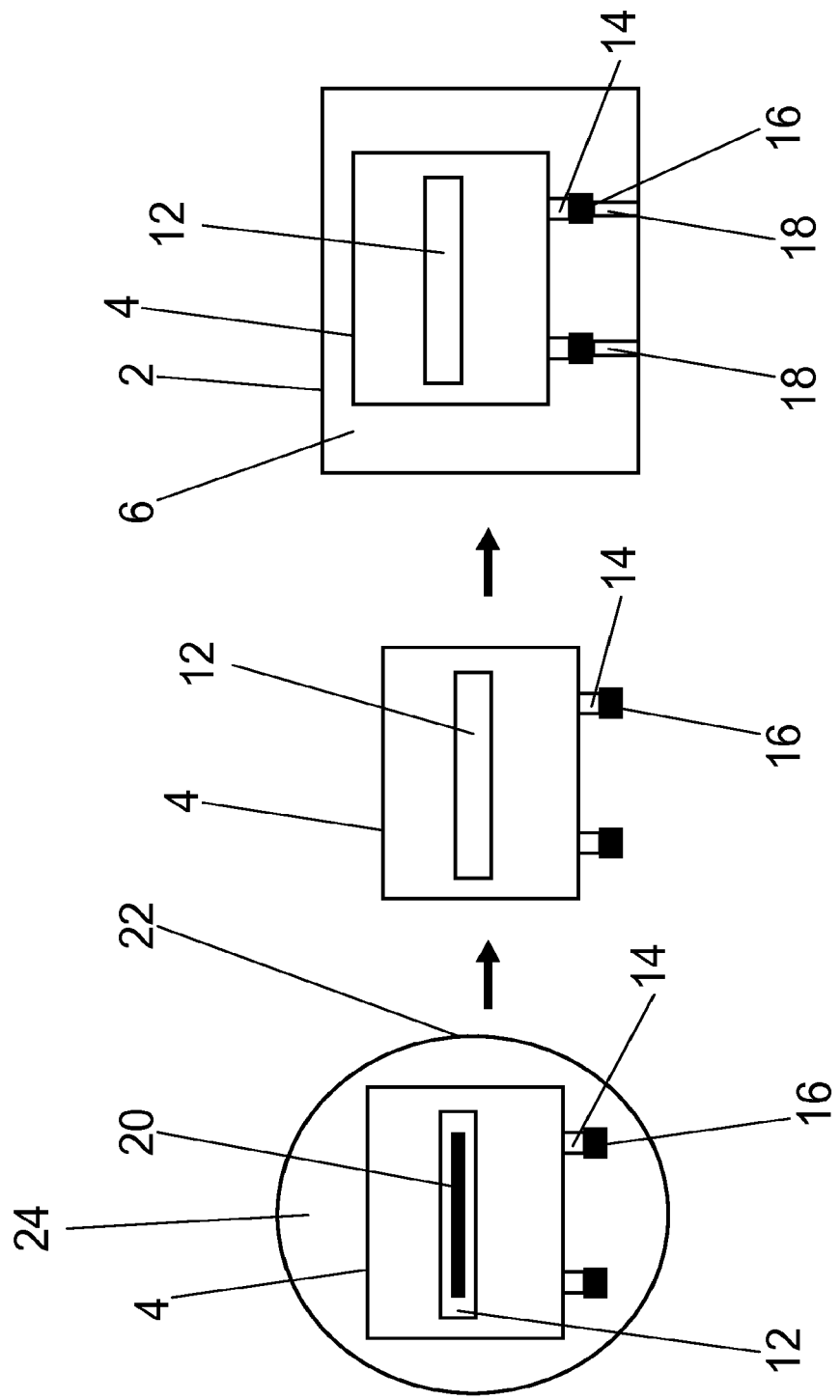
FIG. 3 schematically shows loading of substrates into a coating apparatus in a reaction chamber provided according to the present invention.

FIG. 3 shows one embodiment for loading substrates 20 into a coating apparatus such that the substrates are not exposed to contamination or ambient atmosphere. In other words, FIG. 3 presents one embodiment for inert handling of substrates 20. First a reaction chamber 4 and a substrate 20 is positioned inside a loading chamber 22. The loading chamber 22 has an inert gas atmosphere 24. The inert gas atmosphere 24 may be for example a nitrogen atmosphere. The loading chamber 22 may be a glove box or similar chamber in which substrates 20 may be loaded into a reaction chamber 4 manually or automated.

In a manufacturing line the substrates 20 are packed in a shipment or transport box or a bag (not shown) having an inert gas atmosphere. The shipment box is hermetically closed and transported to a processing site having a loading chamber 22. The shipment box is loaded into the loading chamber 22 and the loading chamber is closed and filled with inert gas. The shipment box is opened in the loading chamber 22 and the substrate 20 is removed from the shipment box and loaded into the reaction chamber 4 through the loading door 12 of the reaction chamber 4.

After the substrate 20 is loaded into the reaction chamber 4, the reaction chamber 4 is hermetically closed inside the loading chamber 22. The hermetical closing of the reaction chamber 4 comprises closing hermetically the loading door 12 of the reaction chamber 4. The reaction chamber 4 comprises also precursor connections 14 and thus the closing the reaction chamber 4 hermetically comprises also closing hermetically the precursor connections 14. It should be noted that in the present invention the substrates 20 are loaded in an inert manner into the reaction chamber such that the substrates are not subjected to the ambient atmosphere or any other contaminating conditions. Therefore the present invention is not restricted to a specific loading arrangement, but the loading of the substrates 20 may be carrier out by any loading arrangement and by any loading method. For example, the substrates 20 may be loaded in an inert manner into the reaction chamber 4 in the production line or production process through a gate valve provided to the reaction chamber.

After the substrate 20 is loaded into the reaction chamber 4 and the reaction chamber 4 is hermetically closed, the loading chamber 22 is opened and the reaction chamber 4 is unloaded from the loading chamber 22 and transported to the apparatus for processing the substrate 20. The reaction chamber 4 may be transported in the ambient atmosphere without risk that the substrate 20 will be contaminated or deteriorated as the reaction chamber 4 hermetically closed. The reaction chamber 4 may also be used for storing the substrate 20 hermetically.

In another embodiment the substrates are not loaded into a shipment box at the manufacturing line, but directly into a reaction chamber 4 according to the present invention. Thus the reaction chamber 4 is also used as a transportation vessel for the substrate 20.

The reaction chamber 4 is then installed to the apparatus arranged to process the substrate 20. The apparatus for processing the substrate 20 is arranged to subject the substrate 20 to alternate surface reactions of at least a first precursor and a second precursor. As shown in FIG. 3, the reaction chamber 4 is installed into a vacuum chamber 2 of the apparatus and the vacuum chamber 2 is closed. The precursor connections 14 of the reaction chamber 4 are connected to the precursor system connections 18 of the apparatus before the vacuum chamber 2 is closed. The vacuum chamber 2 comprises an inner space 6 into which reaction chamber 4 is installed and the vacuum is provided to the inner space 6 after the vacuum chamber 4 is closed.

After the gas valves 16 of the precursor connections 14 may then be opened to provide a fluid connection to the reaction chamber 4. The fluid connection is achieved by connecting precursor connections 14 of the reaction chamber 4 to a precursor system of the apparatus. The precursor system connections 18 and the precursor connections 14 may comprise connectors (not shown) for connecting them together. In some embodiments the precursor system connections 18 may also comprise gas valves or other kind of gas sealings. The precursor system may also be flushed or purged before staring the processing of the substrate 20, and before or after opening the hermetically closed precursor connections 14.

When the gas valves 16 are opened the substrate 20 may be processed according to the principles of atomic layer deposition or the like method. When the processing is finished, the gas valves may be closed and the reaction chamber uninstalled from the vacuum chamber 2. The substrate 20 may be thus further handle in inert conditions.

In a preferable embodiment the loading chamber 22 is positioned apart and remote of the apparatus arranged to process the substrates 20, or apart of a vacuum chamber 2 of the apparatus arranged to process the substrates 20. In one embodiment the apparatus does not comprise any vacuum chamber 2, but only a precursor system connections 18 to which the precursor connections 14 of the reaction chamber 4 are connected. The hermetically sealable reaction chamber 4 makes it possible to use this kind of apparatus having no vacuum chamber 2.

The present invention further concerns use of gastight sealable vessel as a reaction chamber 4 for receiving one or more substrates 20 in a process of subjecting the substrates 20 to successive surface reactions of at least a first precursor and a second precursor.

It is apparent to a person skilled in the art that as technology advanced, the basic idea of the invention can be implemented in various ways. The invention and its embodiments are therefore not restricted to the above examples, but they may vary within the scope of the claims.

The invention claimed is:

1. A method for loading one or more substrates into an apparatus arranged to process the one or more substrates by subjecting at least part of the one or more substrate to successive surface reactions of at least a first precursor and a second precursor, in which method the one or more substrates are loaded in to a reaction chamber comprising:

a chamber body forming a reaction space inside the reaction chamber;

a loading door provided to the chamber body for loading and unloading the one or more substrates into and from the reaction chamber, the loading door comprises one or more sealing elements arranged to seal the loading door and the reaction space inside the reaction chamber hermetically in a closed position of the loading door when the reaction chamber is in the detached state;

precursor connections attached to the reaction chamber for providing a fluid connection between the reaction space of the reaction chamber and precursor system connections of a precursor system by supplying and discharging the at least first and second precursor to and from the reaction space of the reaction chamber, the precursor connections are arranged to be connected to the precursor system connections of the precursor system, the precursor connections are provided with the gas valves arranged to hermetically seal the precursor connections and the reaction space inside the reaction chamber when the precursor connections are detached from the precursor system connections and the reaction chamber is detached from the precursor system, the precursor connections being attached to the reaction chamber and the gas valves being attached to the precursor connections when the precursor connections are detached from the precursor system connections and the reaction chamber is detached from the precursor system, the gas valves remain coupled to the reaction chamber through the precursor connections when the reaction chamber is detached from the precursor system; and couplings provided to the precursor connections for connecting the reaction chamber in fluid connection with the precursor system, the method further comprising:

loading the one or more substrates into the reaction chamber in an inert manner;

closing the reaction chamber hermetically after the one or more substrates are loaded into the reaction chamber in the inert manner, closing the reaction chamber hermetically comprises closing hermetically the loading door and the precursor connections of the reaction chamber;

installing the reaction chamber to the apparatus for processing the substrates; and opening the precursor connections of the reaction chamber.

2. The method according to claim 1, wherein the one or more substrates are loaded into the reaction chamber in a loading chamber having an inert gas atmosphere and the reaction chamber is closed hermetically inside the loading chamber after the one or more substrates are loaded into the reaction chamber.

3. The method according to claim 1, wherein the one or more substrates are loaded into the reaction chamber in a loading chamber positioned apart and remote of the apparatus arranged to process the substrates, or wherein the one or more substrates are loaded into the reaction chamber in a loading chamber positioned apart of a vacuum chamber of the apparatus arranged to process the substrates.

4. The method according to claim 1, wherein the hermetically closed reaction chamber is transferred from a loading chamber to the apparatus in an ambient atmosphere.

5. The method according to claim 1, wherein precursor connections of the reaction chamber are connected to a precursor system of the apparatus, gas lines of the precursor system are purged, and hermetically closed precursor connections of the reaction chamber are opened.

* * * * *